United States Patent [19]

Parker et al.

[11] 4,402,034
[45] Aug. 30, 1983

[54] POLARITY SENSITIVE SOLID STATE RELAY

[75] Inventors: John W. Parker, Rochester; John H. Auer, Jr., Fairport, both of N.Y.

[73] Assignee: General Signal Corporation, Stamford, Conn.

[21] Appl. No.: 301,929

[22] Filed: Sep. 14, 1981

[51] Int. Cl.³ .......................................... H01H 51/22
[52] U.S. Cl. .................................. 361/208; 361/210; 324/117 R; 324/253; 340/38 L
[58] Field of Search ...................... 361/208, 210, 203; 310/152, 155, 168; 365/133, 134; 246/34 R, 249, 77, 34 B; 324/117 R, 253; 340/38 L

[56] References Cited

U.S. PATENT DOCUMENTS

| | | | |
|---|---|---|---|
| 2,835,734 | 5/1958 | Fisher | 361/208 X |
| 3,024,411 | 3/1962 | Hours | 340/38 L |
| 3,040,248 | 6/1962 | Geyger | 340/38 L |
| 3,892,118 | 7/1975 | Wiegand | 365/133 X |
| 3,959,763 | 5/1976 | Sibley et al. | 338/21 |
| 4,050,013 | 9/1977 | Maddox | 324/117 R X |
| 4,236,093 | 11/1980 | Birnbaum | 246/249 X |
| 4,309,628 | 1/1982 | Wiegand | 310/152 X |

Primary Examiner—Reinhard J. Eisenzopf

[57] ABSTRACT

A polarity sensitive relay fabricated of and controlled by, solid state components is provided to produce a more trouble-free and smaller device. The relay may be made in first and second versions, the first of which responds to input signals of a single polarity and the second of which produces first and second output signals in response to input signals of first and second polarities, respectively. The relays include first or second Wiegand modules each of which has a drive coil, an input signal coil and an output signal winding. The Wiegand modules are placed in a steady state magnetic bias and the drive coils pulsed at a predetermined frequency. When two modules are used, the input signal coils are connected in series and in a manner to produce opposite magnetic effects on their associated Wiegand modules. One or the other of the output signal windings will produce a stream of pulses, at the frequency at which the drive coils are driven, in response to a signal of one or the other polarity in the input signal windings. An appropriate magnetic shield is provided to prevent magnetic interference to or from nearby components. A disclosed embodiment is designed to be fail safe meaning that a component failure will not result in an output signal. The relays will not respond to an input signal below a predetermined magnitude.

27 Claims, 10 Drawing Figures

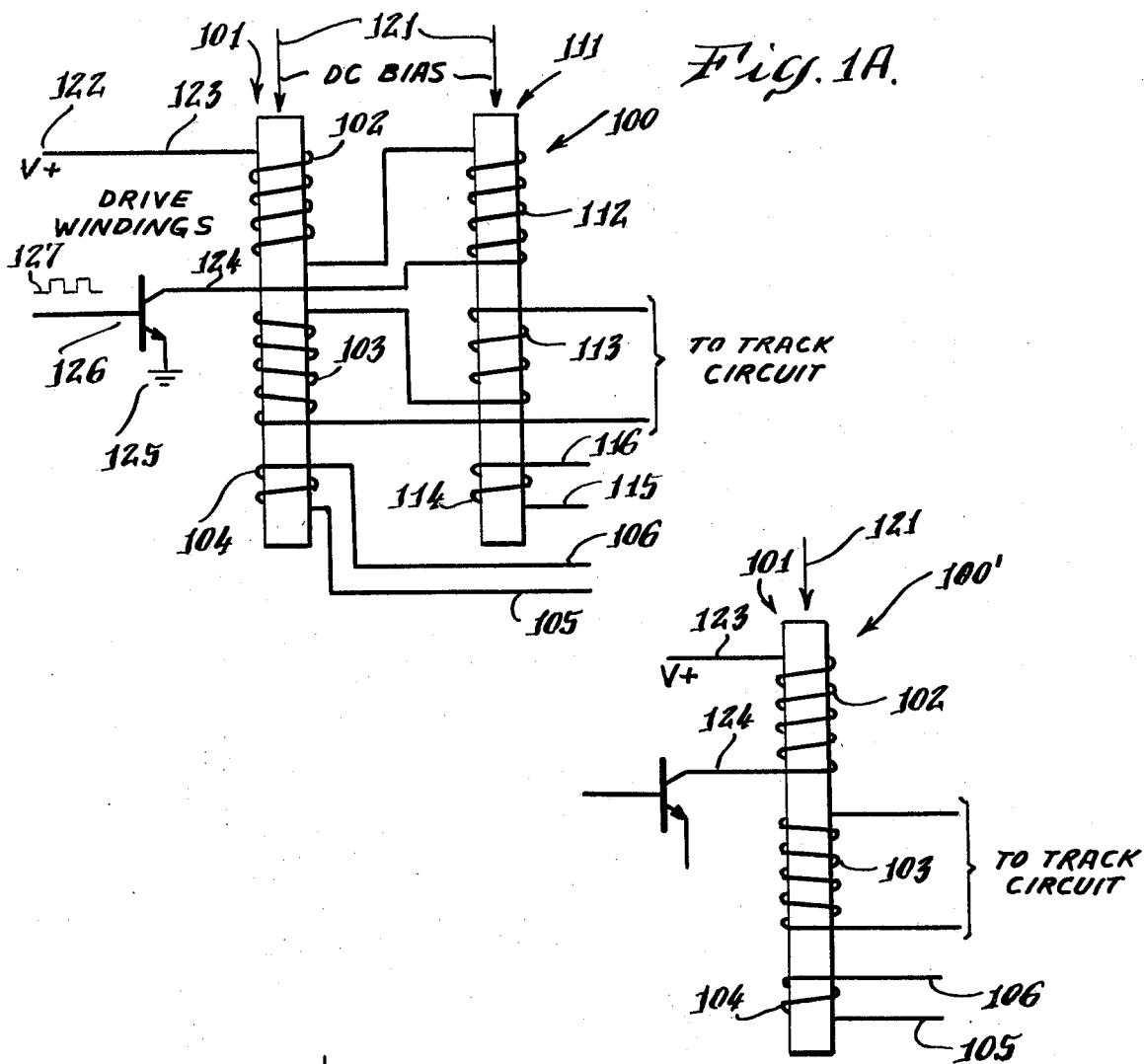
Fig. 1A.
Fig. 1B.
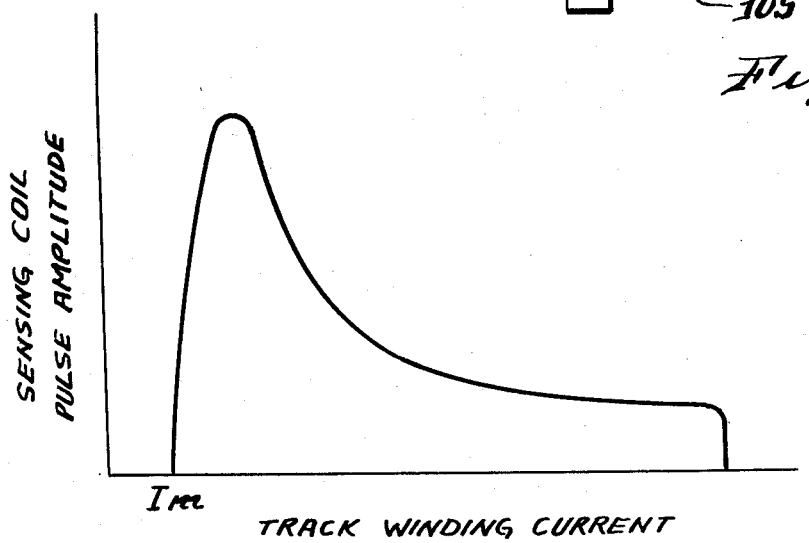
Fig. 3.

NO TRACK CURRENT

TRACK CURRENT OF ONE POLARITY

TRACK POLARITY OF THE OPPOSITE POLARITY

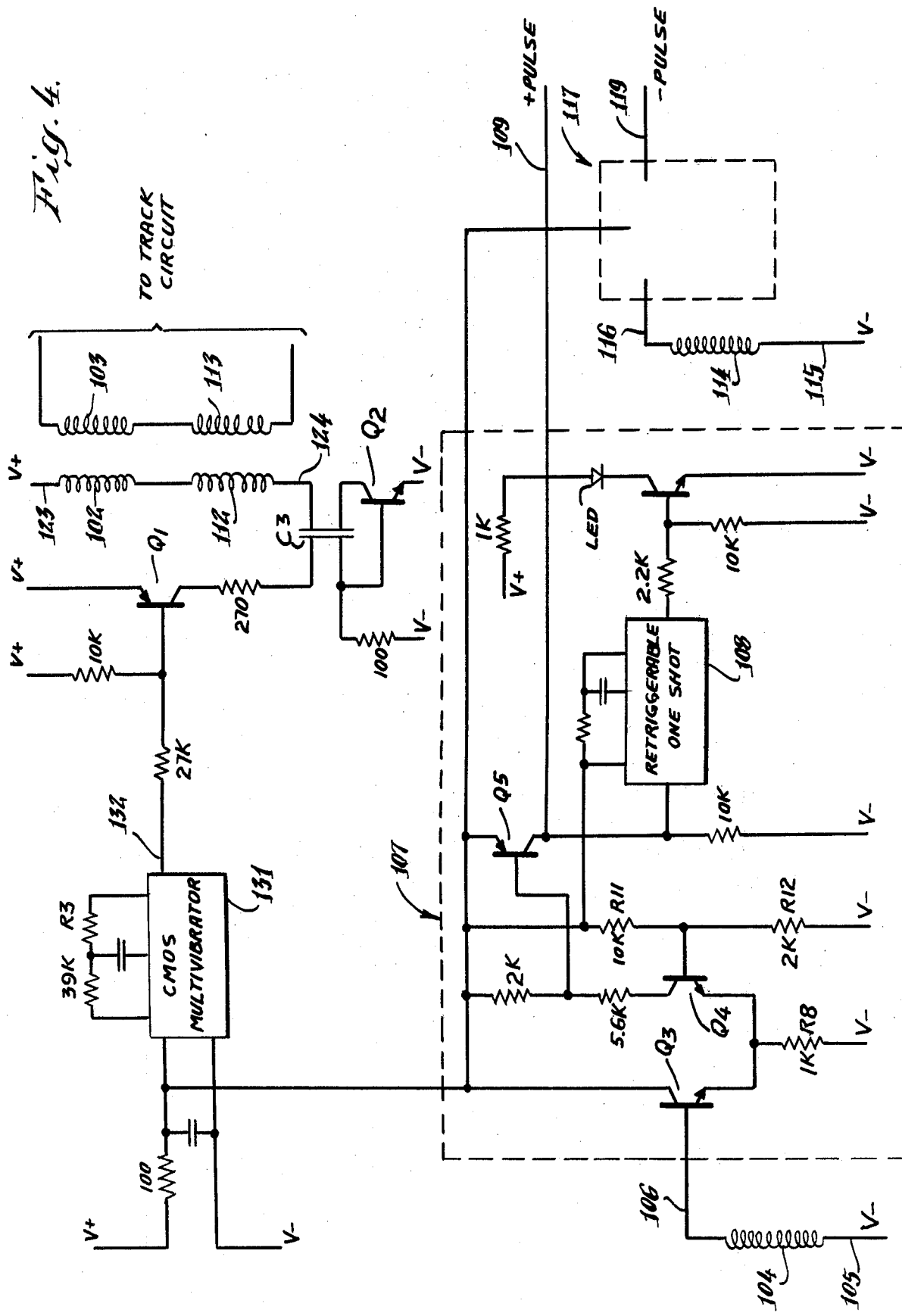

POLARITY SENSITIVE SOLID STATE RELAY

BACKGROUND OF THE INVENTION

Although the public is surprisingly ignorant of the fact, it has been common and standard practice for many decades to use electric signals in railroad tracks for controlling train operation and/or indicating position. In a simple system, a relay is held operated in series with current through both tracks of a track section and the relay is caused to be released when a train enters the track section because the train itself serves to shunt, or interconnect, the two rails of the section. The system is designed so that presence of the train releases a relay rather than causing a relay to operate. This provides a safety feature because a malfunction, such as a power failure, would more likely release a relay than operate one and it is generally considered safer to provide a false signal indicating the presence of a train than to have a false signal indicate the absence of a train.

Since rails are supported on the ground, there tends to be a leakage current between the rails which may be the result of snow, ice and/or water conditions together with other conditions which may affect the ties and/or stone ballast supporting the rails. Excessive leakage current could cause a false train present signal.

Those familiar with relays are well aware that a relay will remain operated on a current which is noticeably less than the current required to operate the relay from its unoperated position. Accordingly, it was recognized many decades ago, that under certain adverse conditions, a detecting relay might fail to release even though a train is present shunting the tracks. To reduce the possibility of having false signals of this nature, systems were introduced which provided a detecting relay which was operated and released periodically even when a train was not present. Then, when a train was present even if the shunt across the tracks was not sufficiently good to cause the release of the relay, the relay would be released by the pulsing circuit and be unable to reoperate because of the shunt on the track. Such relays have been referred to as code-responsive track relays. Although relays of this nature have been used for many decades, they do present certain problems, for example, in order to assure reliable operation, irrespective of adverse weather conditions, vibration and contaminants in the air and/or other conditions familiar to those who work with such equipment, it has been necessary to provide relays which are relatively bulky, costly, and require heavy protective housings.

Over the years, sophisticated techniques have been developed for using relays and track signals for considerably more complex functions than those thus far described. For example, the relays may be used in systems to control traffic lights and crossing arms, and/or to provide signals to or from a train cab relative to conditions ahead and/or concerning appropriate speeds. Many other applications are well-known to those familiar with railroad signaling and the applications and techniques are limited only by the fertile imagination of circuit designers.

Relays having the described characteristics are most frequently used in communication systems. Examples are railroad signal systems, as already cited; telegraph systems; teletype systems; telephone switching systems and others limited only by the ingenuity of the engineer. Accordingly, although the structure is described as used in a railroad environment, it should be understood that the structure may find utility in any system in which the available characteristics may be useful.

An example of a system using relays of the type thus far described may be seen in U.S. Pat. No. 2,934,636 issued Apr. 26, 1960 to Thomas J. Judge and assigned to the same assignee as the present invention. U.S. Pat. No. 3,879,004 issued Apr. 22, 1975 to Charles Andreasen and assigned to the same assignee discloses a somewhat more sophisticated system which will even function in a transit system that does not use steel wheels riding on a steel rail. U.S. Pat. No. 4,172,576 issued Oct. 30, 1979 to Frank A. Svet, Jr. and assigned to the same assignee illustrates an even more sophisticated system and one which utilizes many modern elements and components including solid-state devices. However, as set forth in this patent, selected critical functions are performed in response to the operation and/or release of relays similar to those described in prior patents and used for many decades. U.S. Pat. No. 4,236,093 issued Nov. 25, 1980 to David Birnbaum and assigned to the same assignee illustrates a device which can respond to the proximity of a train and which does not comprise a relay of the type which had been used for many decades. The device used is known as a Wiegand wire and is disclosed in the John R. Wiegand U.S. Pat. No. 3,892,118 issued July 1, 1975. As set forth therein the device comprises a ferromagnetic bi-stable switching module.

SUMMARY OF THE INVENTION

The structure and circuit of this invention provides a polarity sensitive, solid state relay which may be used in a code responsive mode. A magnetic shield may be included to prevent the transmission of magnetic effect to or from other components. The solid state relay may include a single Wiegand wire or a pair of Wiegand wires which are placed in a magnetic field which, of course, could be provided by either permanent or electromagnets. Around each Wiegand wire are wound two coils, a drive coil and an input signal winding usually referred to herein as a track winding. The drive coils are usually connected in series and oriented such that the flux which they produce is in the same direction as the flux of the magnetic field. For code responsive operation, circuit means are provided for causing current through the drive coils to be pulsed on and off. When there is no current in the track windings, the magnetic fields along both Wiegand modules are the same. The track windings are connected in series but oriented such that with a DC track current flowing the field produced by the track winding of one Wiegand wire is opposite to the field produced by the track winding of the other Wiegand wire. Accordingly, with track current of one polarity flowing, the bias field is aided in one module and opposed in the other module. When a single Wiegand module is used, the polarity of the track current may either aid or oppose the bias field.

In addition to the drive windings and the track windings, each Wiegand wire has a pick-up or output signal winding which will produce an output pulse whenever the Wiegand module switches states. Reference may be had to the teachings disclosed in U.S. Pat. No. 3,892,118 issued to John R. Wiegand on July 1, 1975 for a more complete understanding of the contruction and characteristics of Wiegand wires.

In order for the Wiegand modules to switch states and produce output pulses, the surrounding magnetic field must change polarity. Therefore, with no track current applied, neither Wiegand module produces an output signal. With track current of one polarity applied, one module is biased further away from its zero crossing condition and turned further off; the other, under sufficient track current, is eventually biased such that the surrounding field is pulsed both positive and negative. Under this condition, that Wiegand module will produce short output pulses on its pick-up coil at the frequency of the drive signal.

It is an object of this invention to provide a new and improved polarity sensitive relay.

It is a more specific object of the invention to provide a new and improved polarity sensitive relay fabricated of solid state elements.

It is another object of the invention to provide a polarity sensitive solid state relay using Wiegand wire modules.

It is another object of the invention to provide a relay of the character described and which is code responsive.

It is another object of the invention to provide a relay of the character described and which is shielded to prevent the transmission of magnetic effect to or from other components.

It is another object of the invention to provide a relay of the character described which is smaller and more economical than the prior art electro-mechanical relays.

It is another object of the invention to provide a relay of the character described which does not require mechanical adjustments.

It is another object of the invention to produce a relay whose coils have a minimum time constant thereby permitting higher operating frequencies.

It is another object of the invention to provide a relay which is fail-safe; meaning an output signal will not be produced irrespective of the failure of any component.

It is another object of the invention to provide a fail-safe relay which will operate at no less than a predetermined threshold potential.

BRIEF DESCRIPTION OF THE DRAWING

For a better understanding of the present invention together with other and further objects, features and advantages thereof, reference may be had to the following description taken in connection with the accompanying drawing wherein:

FIG. 1A illustrates, in schematic form, the essential components of the polarity sensitive solid state relay;

FIG. 1B illustrates, in schematic form, the essential components of a biased neutral track relay.

FIG. 3 indicates the sensing coil pulse amplitude versus the track winding current; and FIG. 4 comprises a schematic circuit of the various control and output components.

Like elements are given like numbers in all views and in order to assist with identifying the nature and character of circuit elements, numbers identifying resistors, capacitors and transistors have been preceeded by R, C and Q, respectively.

DESCRIPTION OF THE PREFERRED EMBODIMENT

Figure 2A:
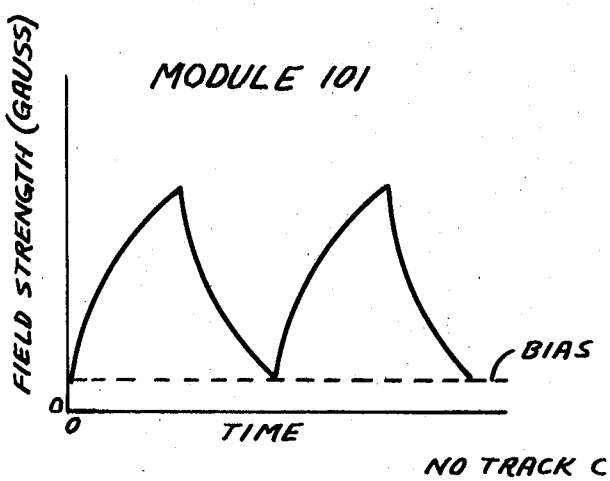
FIGS. 2A through 2F illustrate magnetic field strength versus time under various conditions.

Considering first FIG. 1A, there will be seen therein the essential structural elements which provide the polarity sensitive solid state relay of the invention and which is indicated generally as 100. The solid state relay 100 includes first and second Wiegand modules designated 101 and 111, respectively. The Wiegand modules 101 and 111 are placed in a DC magnetic bias field having a direction as indicated by the arrows 121. The DC bias 121 may be provided by means of permanent magnets (not shown) and/or by electromagnets (not shown). Around each of the Wiegand modules 101 and 111 are wound two coils. The first coil comprises a drive coil designated, respectively, 102 and 112. As may be seen from the sketch of FIG. 1A, the drive coils 102 and 112 are connected in series and oriented such that when current is flowing through these coils, the flux which they produce is in the same direction as the flux of the DC bias field 121. An input potential 122 is applied to lead 123 of drive coil 102 and a current will pass through drive coils 102 and 112 in series emerging at lead 124 and passing to ground 125 when transistor 126 is turned on. For code responsive operation, the transistor 126 is turned off and on in response to the application of a square wave input signal 127 to the base of the transistor 126 all as will be described in greater detail with respect to FIG. 4.

In addition, each Wiegand module 101 and 111 has a track winding, or input signal winding, designated 103 and 113, respectively. The windings 103 and 113 are connected in series but in opposing directions such that with a DC track current flowing through the windings 103 and 113 in series, the magnetic field produced by one is opposite to that produced by the other. Thus with track current of one polarity flowing the bias field is aided in one of the modules 101 or 111 and is opposed in the other of the modules.

Considering now FIG. 1B, it will be seen that it is substantially identical to FIG. 1A except that only a single Wiegand module is used in the similar relay 100' which comprises a biased neutral relay. The relay 100' will be seen to be sensitive to current of one direction through winding 103 but insensitive to current of the other direction through winding 103.

It is believed that the operation of relay 100' will be understood as a simplified version of the relay 100 which will be described in particularity and that therefore it will be unnecessary to describe the relay 100' in detail.

Figure 2B:
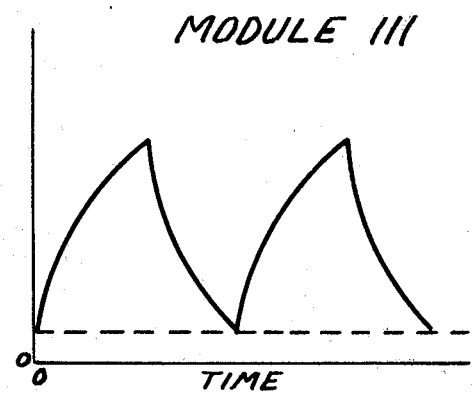

Considering now more specifically FIGS. 2A through 2F, there will be seen the different possible conditions of the magnetic field strength of the Wiegand modules 101 and 111. In response to different current conditions in the track windings 103 and 113, the various figures show time in the horizontal direction and magnetic field strength as measured in gauss in the vertical direction. As shown in FIGS. 2A and 2B, there is a dotted horizontal line which represents the DC bias 121 as shown in FIG. 1. When there is no current in the windings 103 and 113, the field strength in the modules 101 and 111 will rise from the positive bias as indicated by the dotted line to a more positive value, the magnitude of which will be a function of the product of the current in the windings 102 and 112 and the number of turns of these windings. The field strength rises and falls at a rate determined by the frequency of the square wave input signal 127 to the base of the transistor 126. Assuming the coils 102 and 112 are identical, it will be seen that the curves of FIGS. 2A and 2B are identical. The curves are not square due to the inductance of windings 102 and 112.

Figure 2C:
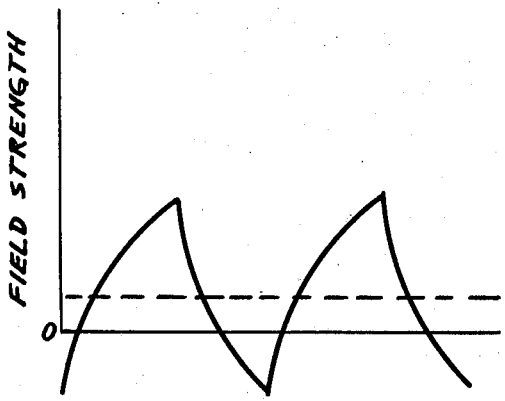
Figure 2D:
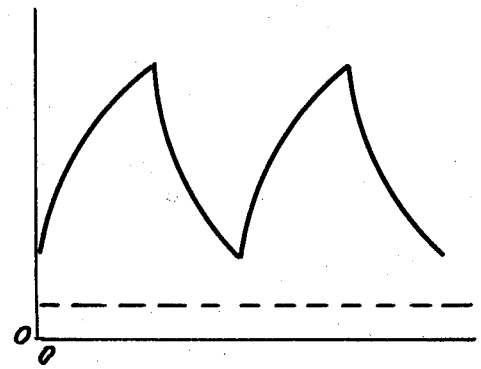

Considering now FIGS. 2C and 2D, it should be understood that these curves represent the field strength of modules 101 and 111, respectively when there is track current of a predetermined polarity flowing in the track windings 103 and 113 in series. It should be recalled that it has been mentioned that the windings 103 and 113 are connected such that the magnetic field produced by one is opposite to that produced by the other. Accordingly, for the track current of the assumed direction, the field strength of module 101 has been proportionately reduced while the field strength of module 111 has been proportionately increased. As may be seen in FIGS. 2E and 2F, if there is a track current of the opposite polarity flowing in coils 103 and 113 in series, the field strength of module 101 will be increased while that of 111 will be decreased.

Figure 2E:
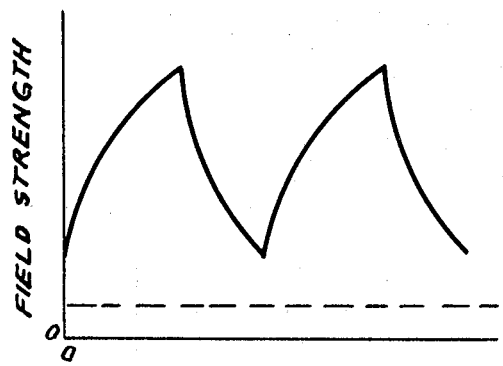
Figure 2F:
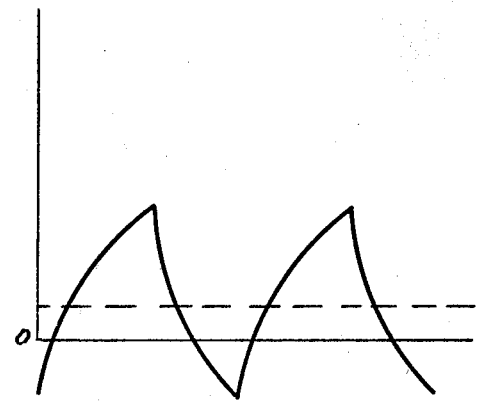

In addition to the drive windings 102 and 112 and the track windings 103 and 113, the modules 101 and 111 have sensing coils, or output signal coils, 104 and 114, respectively. The sensing coils 104 and 114 sense when their respective modules 101 and 111 switch states and produce output pulses. In order for the Wiegand modules 101 and 111 to switch states and produce output pulses through their sensing coils 104 and 114, the surrounding magnetic field must change polarity. As seen in FIGS. 2A and 2B, when there is no track current applied in the windings 103 and 113, neither Wiegand module produces an output signal because there is no change in magnetic polarity. With a track current of one polarity applied, one module is biased further away from the zero flux strength and turned further off. The other module, under sufficient track current, is eventually biased such that the surrounding field is pulsed both positive and negative. Under this condition that Wiegand module will produce short output pulses on its sensing coil 104 or 114 at a frequency corresponding to that of the square wave input 127 to the transistor 126 controlling the flow of current in the drive windings 102 and 112. Thus with the track current of the polarity shown in FIGS. 2C and 2D, the module 101 will produce output pulses on the sensing coil 104 because the surrounding magnetic field changes polarity. Conversely, with track current of the opposite polarity as shown in FIGS. 2E and 2F the Wiegand module 111 will produce an output signal in the sensing coil 114.

The Wiegand modules 101 and 111 will produce a maximum output pulse amplitude at their respective sensing coils 104 and 114 under asymmetrical drive condition; that is, when flux excursions are much greater in one direction than in the other. Therefore, the response of the Wiegand modules to different levels of track current is as shown in FIG. 3. The sensing coil 104 or 114 of their respective Wiegand modules 101 and 111 will not produce an output signal until the DC bias is overcome. This current value is indicated in FIG. 3 as current $I_m$. With an increase of the track winding current, the magnitude of the output pulse at the sensing winding 104 or 114 rises sharply with further increase in track current until a maximum is reached. Further increases in the track current will result in reduced output pulse amplitudes. This reduced output pulse occurs because the drive signal is becoming increasingly symmetrical and eventually asymmetrical of the opposite polarity. Eventually, if the track current is sufficiently high, the Wiegand modules are biased off in the negative direction and no output pulses are produced. The Wiegand modules 101 and 111 thus have a range of operation dependent upon the amplitude of the field produced by the drive coils. It was found that a peak drive field of approximately 300 gauss provided an adequate operating range for the contemplated application. It is probable that other peak drive fields might be suitable for other applications.

As stated, the magnetic bias 121 for the modules 101 and 111 could be provided by permanent magnets or electromagnets. Unless it is desired to be able to vary the bias in response to an electric signal, it is contemplated that permanent magnets would be used as they would be less subject to failure and require less energy.

The drive coils 102 and 112 could be connected in parallel but a series connection has the advantage that if either goes open circuit, there is a total failure rather than a partial failure.

DRIVE COIL DESIGN

The ampere turns (NI) needed to provide a desired field strength can be determined by standard equations and/or experiment.

For a desired field strength of the order of 300 gauss. It was found the drive coils 102 and 112 must provide approximately 850 ampere turns. It would be possible to design any number of coils to this specification. It is apparent that a reduction in the number of turns results in a reduction in outside diameter of the coil and thus in size. However, this reduction in size comes at the expense of increased current and power dissipation required to keep the NI product constant. Advantageous spool design allowed for a reduced cross-sectional area of the drive coil. A reduced coil area provides two advantages. First it allows the overall size of the coil to be reduced and secondly because the inductance of any coil is directly proportional to its cross-sectional area, it allows the coil inductance to be reduced. A reduction of coil inductance allows time constant of the coil (T=L/R) to be reduced, and a reduced time constant allows the coil to operate at higher frequencies. However, a reduced cross-sectional area of the drive coil also results in increased inductive coupling between the drive coil 102 or 112 and the sensing coil 104 or 114.

MECHANICAL STRUCTURE

The mechanical structure of the device of FIG. 1 may be placed in a box made from a magnetic shield alloy and having a size approximately 2½×4×1 inch. It is anticipated that the Wiegand wire modules may be molded directly inside the plastic spool on which the drive and track windings are wound. A suitable Wiegand wire module may comprise Model No. 30366 manufactured by The Sensor Engineering Company. These models have the same electrical properties as their Model 30020.

The DC magnetic bias for the Wiegand wire modules 101 and 111 may be provided by a plurality of pairs of cylinder magnets placed so that their fields are in alignment with each Wiegand module and all aligned in the same direction so as to produce a DC field from one set of magnets to another along the Wiegand modules. The operating point of the device may be adjusted by moving the magnets toward or away from the coil holders. The structure could be designed to allow adjustment of either or both the upper or lower permanent magnets. It was found that it was readily possible to provide magnetic adjustment which varied the pick-up current of the relay 100 over a satisfactory range.

SHIELD MATERIAL

Most shield material manufacturers produce three grades of magnetic shielding material, each with different magnetic shielding properties. An iron alloy of roughly 4% silicon is available at low cost but with relatively poor shielding characteristics. A medium level alloy of roughly 50% nickel is made by most companies to provide considerably improved shielding properties as compared with the lower cost material. Finally, an alloy of roughly 80% nickel is available.

The effectiveness of a material as a magnetic shield is a function of its permeability and/or system requirements. High permeability materials function as good shields as they offer low reluctance to the flow of magnetic lines in comparison to the reluctance of the space inside the shield. The higher quality materials may have maximum permeabilities in the order of 100,000-250,000. The lower quality silicon-iron materials may have permeabilities of 8,000. On the other hand, the better quality materials have lower saturation induction. When a material goes into saturation, it loses its shielding properties because it cannot handle further increases in field. Increased field will then flow through the space internal to the shield. Thus, at low field strength, a high grade material will provide better shielding than a low grade material, but at high field strengths, the low grade material may provide better shielding because it has not saturated.

These and other appropriate factors should be considered in selecting shield material.

ELECTRONIC CIRCUITRY

A more detailed circuit for operating the structure of FIG. 1 is shown in FIG. 4. The circuit of FIG. 4 is not necessarily arranged to show the physical relationship of the various windings as is the case with FIGS. 1A and 1B. However, the windings 102, 103, 104, 112, 113 and 114 are all to be found in FIG. 4. As may be seen by comparing the sensing coils 104 and 114 of FIG. 1A with the same coils as shown on FIG. 4, it will be seen that the leads 105 and 115 are connected to a negative potential indicated as V— as illustrated in FIG. 4. The other leads from the sensing coils, namely 106 and 116 are connected to respective output level detectors 107 and 117, respectively. It should be understood that the two output pulse level detectors 107 and 117 are identical. Accordingly, only the circuitry for the output pulse level detector 107 is illustrated.

It should be understood that the circuits illustrated are illustrative of the type of controls and sensors which may be provided and that other and/or modified circuits may be provided as may be suitable for the requirements of the system in which the polarity sensitive solid state relay may be used.

Power will be applied to the circuit of FIG. 4 by a suitable DC power supply whose positive terminal is indicated in the circuit of FIG. 4 by the symbol V+ and the negative terminal is indicated, as has already been mentioned, by the symbol V—. The actual drive signal is provided by a CMOS multivibrator 131. The CMOS multivibrator produces a square wave output signal which is applied to the base of transistor Q1. Tuning of the multivibrator 131 is provided by selection and/or adjustment of resistor R3. The square wave output on lead 132 is amplified by transistors Q1 and Q2 which are used to switch current through the drive coils 102 and 112.

It has been mentioned that the reduction in size of the drive coils 102 and 112 increased the inductive coupling between these coils and their respective pick-up coils 104 and 114 of the Wiegand modules 101 and 111. It was found that the resulting inductive coupling was large enough to keep the relay 100 activated with no track current present. That is, the induced voltage in the pick-up coils was greater than 2 volts, the threshold level of the output pulse detectors 107 and 117. In order to reduce this inductively coupled voltage, the 4-terminal capacitor C3 was added to slow down the turn on and turn off rate of Q2 and to reduce the rate of change of the flux produced by the drive signals which, in turn, reduces the voltage coupled into the pick-up coils 104 and 114. With the addition of capacitor C3, the induced voltage was reduced to 0.3 volts which provides considerable safety margin for a 2 volt threshold. For a discussion of the purpose and function of 4-terminal devices, reference may be had to U.S. Pat. No. 3,959,763 issued May 25, 1976 to H. C. Sibley et al. and assigned to the same assignee as this application.

As has been mentioned, the output pulse level detectors 107 and 117 are identical and therefore the circuitry is shown only for the detector 107. The level detection is accomplished by the differential amplifier formed by the transistors Q3 and Q4 for the positive level pulse detector 107. The base of transistor Q4 is tied to a reference potential formed by the resistor voltage divider R11 and R12. R11 must be a decreasing only failure mode resistor and R12 must be an increasing only failure mode resistor. This provides fail-safe conditions and under failure conditions, the reference voltage and the detection threshold can then only increase. R8 must also be an increasing only failure mode resistor. When the input voltage to transistor Q3 is less than the threshold voltage, transistor Q3 is off while transistors Q4 and Q5 are held on. When the input voltage exceeds the reference voltage, transistor Q3 turns on and transistors Q4 and Q5 turn off. The circuit output is taken from the collector of transistor Q5 and is a sequence of negative going pulses at the frequency of the drive signal provided by the multivibrator 131. The retriggerable one-shot 108 is used to widen the pulse lengths in order to provide sufficient energy to drive the LED, which is a light emitting diode, to provide a visual indication of circuit operations. As already stated the negative pulse level detector 117 operates in the same manner as the detector 107. Typical values for many resistors have been indicated in FIG. 4.

The inductance of the track windings 103 and 113 is of the order of 143 microhenrys which is quite low compared to that of prior art mechanical relays. Accordingly, it is apparent that induced 60 Hz noise in the rails could cause false operation of the relay 100 or 100' unless provision is made to increase its noise rejection capabilities. It was found expedient to place a blocking inductor in series with the track windings 103 and 113 in order to prevent interference from 60 Hz signals in the track.

The normal noise-free output of the relay 100 is either no pulse train on the output leads 109 and 119 or a steady pulse train occurring on one or the other of the output leads at the fixed rate of the frequency of the drive signal. Noise on the output leads 109 and/or 119 could be eliminated by counting or integrating the output pulses over a short period of time. For example, equal to one or two cycles of 60 Hz. With no noise present, the count should be a fixed value equal to the number of drive pulses in the allotted time period. The effect of noise on this count is to reduce it. For example, with no DC current present, but with a very large 60 Hz current flowing, the current level can only exceed either threshold for 50% of the time. Therefore, the pulse count from either level detector 107 or 117 would be reduced by 50% over the allotted time period. Similarly, with a DC current greater than the pick-up current flowing, the effect of AC noise is a drop in the output count if the noise causes the input current to drop below the threshold. Thus the effect of noise is to cause a count reduction which may be interpreted as noise rather than signal. This is a failure in the safe direction.

It will be apparent to those versed in the applicable arts that the polarity sensitive code responsive solid state relay 100 or the biased neutral relay 100′ may be used in a wide variety of applications other than the specific application described for use in connection with railroad work. In other applications, voltages used and coil design might vary.

While there has been shown and described what is considered at present to be the preferred embodiment of the invention, modifications thereto will readily occur to those skilled in the related arts. For example, the drive coils could have been placed in parallel, different coil configurations used and/or modified control circuits used. It is believed that no further analysis or description is required and that the foregoing so fully reveals the gist of the present invention that those skilled in the applicable arts can adapt it to meet the exigencies of their specific requirements. It is not desired, therefore, that the invention be limited to the embodiment shown and described, and it is intended to cover in the appended claims all such modification as fall within the true spirit and scope of the invention.

What is claimed is:

1. A solid state polarity sensitive relay comprising in combination:
   (a) A bi-stable ferromagnetic switching module having a sensing coil for providing an output pulse in response to a flux reversal;
   (b) means for producing a steady state magnetic field for biasing said module with a predetermined flux field;
   (c) a first coil wound on said module for providing a flux with a first orientation in said module in response to a current in said first coil;
   (d) a second coil wound on said module for providing a flux in said module in response to a current in said second coil; and
   (e) a square wave control signal coupled to said first coil for effecting flux reversals in said module when a current within a predetermined range flows in said second coil; whereby
   (f) with a current of a first direction in said second coil, said steady state magnetic field is aided while with a current, of a second direction opposite to said first direction, in said second coil said steady state magnetic field is opposed.

2. The combination as set forth in claim 1 wherein said square wave control signal is produced by a multivibrator.

3. The combination as set forth in claim 2 and including an amplifier for amplifying the pulse input to said first coil.

4. The combination as set forth in claim 3 wherein said amplifier includes control means for reducing the rate of change of the flux produced by the drive signal.

5. The combination as set forth in claim 4 wherein said control means comprises a capacitor.

6. The combination as set forth in claim 5 wherein said capacitor comprises a four terminal capacitor.

7. The combination as set forth in claim 1 wherein said output pulse is applied to a detector including a differential amplifier for responding when the output pulse exceeds a predetermined threshold voltage.

8. The combination as set forth in claim 7 wherein said detector includes a visual signal of circuit operation.

9. The combination as set forth in claim 8 wherein said visual signal comprises a light emitting diode.

10. The combination as set forth in claim 9 wherein said detector includes a retriggerable one-shot for widening the output signal pulse length in order to provide sufficient energy to drive said visual signal.

11. The combination as set forth in claim 1 and including a level detector coupled to said sensing coil for responding to the output signal level of said sensing coil only when the signal level exceeds a predetermined threshold.

12. The combination as set forth in claim 11 wherein said level detector includes control means for inhibiting the response of said level detector to signals below said threshold level.

13. The combination as set forth in claim 12 wherein said control means comprises a pair of resistors one of which is a decreasing only failure mode resistor and the other is an increasing only failure mode resistor.

14. A solid state polarity sensitive relay comprising in combination:
   (a) first and second bi-stable ferromagnetic switching modules each having a sensing coil for providing output pulses in response to flux reversals;
   (b) means for producing a steady state magnetic field for biasing said first and second modules with a predetermined flux field;
   (c) a first coil wound on each of said first and second modules for providing a flux with like orientation in each of said first and second modules in response to a current in said first coils;
   (d) a second coil wound on each of said first and second modules for providing a flux with opposite orientations in each of said first and second modules in response to a current in said second coils; and
   (e) a square wave control signal coupled to said first coils for effecting flux reversals in one of said first and second modules when a current within a predetermined range flows in said second coils; whereby
   (f) with a current of a first direction in said second coils, said steady state magnetic field is aided and opposed in said first and second modules, respectively, while with a current, of a second direction opposite to said first direction, in said second coils said steady state magnetic field is opposed and aided in said first and second modules, respectively.

15. The combination as set forth in claim 14 wherein said first coils are connected in series.

16. The combination as set forth in claim 14 wherein the pulsed current in said first coils is pulsed on and off by means of a multivibrator.

17. The combination as set forth in claim 16 and including an amplifier for amplifying the pulses input to said first coils.

18. The combination as set forth in claim 17 wherein said amplifier includes control means for reducing the rate of change of the flux produced by the drive signal.

19. The combination as set forth in claim 18 wherein said control means comprises a capacitor.

20. The combination as set forth in claim 19 wherein said capacitor comprises a four terminal capacitor.

21. The combination as set forth in claim 14 wherein said output pulses are applied to a detector including a differential amplifier for responding when the output pulses exceed a predetermined threshold voltage.

22. The combination as set forth in claim 21 wherein said detector includes a visual signal of circuit operation.

23. The combination as set forth in claim 22 wherein said visual signal comprises a light emitting diode.

24. The combination as set forth in claim 23 wherein said detector includes a retriggerable one-shot for widening the output signal pulse length in order to provide sufficient energy to drive said visual signal.

25. The combination as set forth in claim 14 and including first and second level detectors coupled to said sensing coils of said first and second modules, respectively, for responding to the output signal level of said sensing coils only when the signal level exceeds a predetermined threshold.

26. The combination as set forth in claim 25 wherein said level detectors include control means for inhibiting the response of said level detectors to signals below said threshold level.

27. The combination as set forth in claim 26 wherein said central means comprise a pair of resistors one of which is a decreasing only failure mode resistor and the other is an increasing only failure mode resistor.

* * * * *